(12) United States Patent
De Falco et al.

(10) Patent No.: US 12,706,569 B2
(45) Date of Patent: Aug. 11, 2026

(54) WIDEBAND CURRENT-SCALED DOHERTY AMPLIFIER

(71) Applicant: QUALCOMM Incorporated, San Diego, CA (US)

(72) Inventors: Paolo Enrico De Falco, San Diego, CA (US); Tsu-Wei Lin, San Diego, CA (US); Ning Zhu, Chandler, AZ (US); Antonino Scuderi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 509 days.

(21) Appl. No.: 18/336,902

(22) Filed: Jun. 16, 2023

(65) Prior Publication Data

US 2024/0421774 A1 Dec. 19, 2024

(51) Int. Cl.
*H03F 1/02* (2006.01)
*H03F 3/21* (2006.01)

(52) U.S. Cl.
CPC .......... *H03F 1/0288* (2013.01); *H03F 3/211* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 9,614,479 | B2 | 4/2017 | Hallberg et al. |
| 2017/0040953 | A1 | 2/2017 | Beltran Lizarraga et al. |
| 2020/0228065 | A1 | 7/2020 | Ahn et al. |
| 2020/0350867 | A1 | 11/2020 | Takenaka |

FOREIGN PATENT DOCUMENTS

| | | |
|---|---|---|
| WO | 2017001004 A1 | 1/2017 |

OTHER PUBLICATIONS

International Search Report and Written Opinion—PCT/US2024/029795—ISA/EPO—Aug. 20, 2024.

Karthaus U., et al., "A 45 dBm Balanced Power Amplifier Module Based on Four Fully Integrated Doherty PA MMICs A Scalable Solution for Cellular Infrastructure Active Antenna Systems", 2012 Proceedings of the 7th European Microwave Integrated Circuits Conference (EUMIC), Oct. 29, 2012, pp. 647-650, XP032345670, abstract, figure 5.

(Continued)

*Primary Examiner* — Andrea Lindgren Baltzell
*Assistant Examiner* — Malane Lieng
(74) *Attorney, Agent, or Firm* — Loza & Loza LLP

(57) ABSTRACT

A Doherty amplifier is provided with a lumped-element combiner that includes a first capacitor and an inductor. Should the inductor be coupled between an output terminal of the main amplifier and an output node of the Doherty amplifier, the first capacitor couples between an output terminal of the auxiliary amplifier and the output node. Conversely, if the first capacitor is coupled between the output terminal of the main amplifier and the output node, then the inductor couples between the output terminal of the auxiliary amplifier and the output node. A current scaling ratio of the Doherty amplifier ranges from 0.4 to 0.6 to enhance the bandwidth.

30 Claims, 10 Drawing Sheets

(56) References Cited

OTHER PUBLICATIONS

Zhou H., et al., “A Wideband and Highly Efficient Circulator Load Modulated Power Amplifier Architecture”, IEEE Transactions on Circuits and Systems—I: Regular Papers, IEEE, US, vol. 70, No. 8, May 25, 2023, pp. 3117-3129, XP011945419, p. 3120, left-hand column, paragraph 2, figures 1,2.

Hallberg W., et al., “A Doherty Power Amplifier Design Method for Improved Efficiency and Linearity”, IEEE Transactions on Microwave Theory and Techniques, vol. 64, No. 12, Dec. 2016, pp. 4491-4504.

Ozen M., “Symmetrical Doherty Power Amplifier with Extended Efficiency Range”, IEEE Transactions on Microwave Theory and Techniques, vol. 64, No. 4, Apr. 2016, pp. 1273-1284.

WIDEBAND CURRENT-SCALED DOHERTY AMPLIFIER

FIELD OF TECHNOLOGY

The present disclosure relates generally to wireless communications and more specifically to a wideband current-scaled Doherty amplifier.

BACKGROUND

Modern wireless communication standards such as the fourth generation (4G) or fifth generation (5G) use orthogonal frequency division multiplexing (OFDM) due to its advantageous bandwidth utilization and robustness to electromagnetic interference. But the benefits of OFDM come at the cost of a relatively high peak-to-average-power-ratio (PAPR). An amplifier biased for efficient operation at the average power of an OFDM signal will then be saturated or clipped at the peak power of the OFDM signal. If the amplifier is instead biased for efficient operation at the peak power of the OFDM signal, the amplifier operation at the average power of the OFDM signal is inefficient.

SUMMARY

The following summary discusses some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

In accordance with an aspect of the disclosure, a Doherty amplifier is provided that includes: a main amplifier configured to conduct a main amplifier current at a peak power of the Doherty amplifier; an auxiliary amplifier configured to conduct an auxiliary amplifier current at the peak power of the Doherty amplifier, wherein a current scaling ratio as defined by a ratio of the auxiliary amplifier current to the main amplifier current is greater than or equal to 0.4 and less than or equal to 0.6; an output node; an inductor coupled between an output terminal of the main amplifier and the output node; and a first capacitor coupled between an output terminal of the auxiliary amplifier and the output node.

In accordance with another aspect of the disclosure, a Doherty combiner semiconductor package for a Doherty amplifier is provided that includes: a first terminal configured to couple to an output terminal of a main amplifier in the Doherty amplifier; a second terminal configured to couple to an output terminal of an auxiliary amplifier in the Doherty amplifier; a third terminal configured to couple to an output node of the Doherty amplifier; an inductor coupled between the first terminal and the third terminal; and a first capacitor coupled between the second terminal and the third terminal.

In accordance with yet another aspect of the disclosure, a Doherty amplifier is provided that includes: a main amplifier configured to conduct a main amplifier current at a peak power of the Doherty amplifier; an auxiliary amplifier configured to conduct an auxiliary amplifier current at the peak power of the Doherty amplifier, wherein a current ratio $r_c$ as defined by a ratio of the auxiliary amplifier current to the main amplifier current is greater than or equal to 0.4 and less than or equal to 0.6; an output node; a first capacitor coupled between an output terminal of the main amplifier and the output node; and an inductor coupled between an output terminal of the auxiliary amplifier and the output node.

Finally, in accordance with another aspect of the disclosure, a method of operation for a Doherty amplifier is provided that includes: splitting an RF input signal into a first RF signal and a second RF signal; amplifying the first RF signal in a main amplifier of the Doherty amplifier to produce a main amplifier output signal, wherein the main amplifier is configured to conduct a main amplifier current at a peak power of the Doherty amplifier; amplifying the first RF signal in an auxiliary amplifier of the Doherty amplifier to produce an auxiliary amplifier output signal, wherein the auxiliary amplifier is configured to conduct an auxiliary amplifier current at the peak power of the Doherty amplifier; coupling the main amplifier output signal through an inductor to an output node of the Doherty amplifier; and coupling the auxiliary amplifier output signal through a first capacitor to the output node.

Other aspects, features, and implementations of the present disclosure will become apparent to those of ordinary skill in the art, upon reviewing the following description of specific, exemplary implementations of the present disclosure in conjunction with the accompanying figures. While features of the present disclosure may be discussed relative to certain implementations and figures below, all implementations of the present disclosure can include one or more of the advantageous features discussed herein. In other words, while one or more implementations may be discussed as having certain advantageous features, one or more of such features may also be used in accordance with the various implementations of the disclosure discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various implementations and to explain various principles and advantages in accordance with the present disclosure.

DETAILED DESCRIPTION

The high PAPR of OFDM and similar signals poses a dilemma for amplifiers. Should an amplifier be biased for efficient operation at the peak power of an OFDM signal, the amplifier will then operate with poor efficiency while the OFDM signal power is below this peak power. This lower efficiency would then be particularly problematic since the majority of the signal transmission occurs with the OFDM signal power below the peak power. Should the amplifier instead be biased for efficient operation at the average power of the OFDM signal, clipping or saturation then occurs when the OFDM signal transitions to its peak power.

Figure 1:
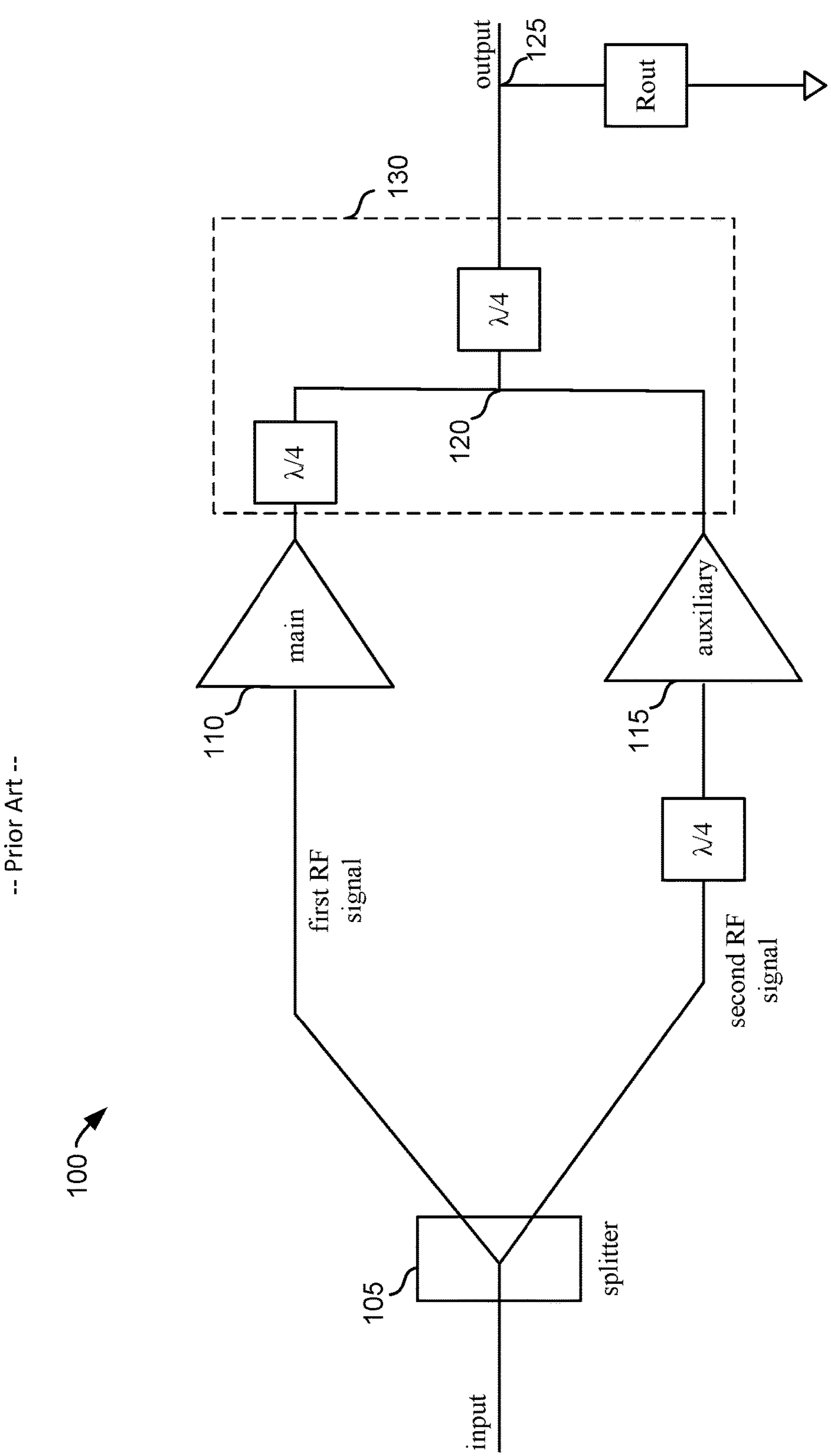
FIG. 1 illustrates a Doherty amplifier.

A Doherty amplifier solves this dilemma because a Doherty amplifier includes a main amplifier and an auxiliary amplifier that combine for peak efficiency not only at the average power of the radio frequency (RF) input signal but also at peak power of the RF input signal. A Doherty amplifier 100 is illustrated in FIG. 1. An RF input signal (input) is split equally in a splitter 105 into a first RF signal and a second RF signal. The first RF signal propagates over a first transmission line having a first electrical length to form a first input signal to a main amplifier 110. The second RF signal propagates over a second transmission line to form a second input signal to an auxiliary amplifier 115. The second transmission line has a second electrical length (e.g., potentially implemented by a phase shifter or other technique) that is greater than the first electrical length by λ/4, where λ is the carrier wavelength of the OFDM signal. Given this electrical length difference for the propagation of the first and second split signals, a current conducted by the main amplifier 110 at peak power is delayed in phase by 90° (a quadrature phase relationship) with respect to a current conducted by the auxiliary amplifier 115 at peak power.

A combining network 130 combines the output signals from each of the main amplifier 110 and the auxiliary amplifier 115 to produce a combined RF output signal (output) at an output node 125. The combining network 130 includes an output transmission line extending from an output terminal of the main amplifier 110 to a combining node 120 that has an electrical length that is longer by λ/4 than an output transmission line from an output terminal of the auxiliary amplifier 115 to the node 120. Node 120 couples through an output transmission line of an electrical length of λ/4 to the output node 125. Node 125 is loaded by an output load Rout. The main amplifier 110 is typically biased to function as a class B (or class AB) amplifier whereas the auxiliary amplifier 115 is biased to function as a class C amplifier that cuts off at 6 dB from the peak power of the RF output signal.

Splitter 105 is typically configured to split the RF input signal according to a 50:50 power split such that the power of the first and second RF signals is equal. Similarly, the current conducted by the auxiliary amplifier 115 at peak power typically equals the current conducted by the main amplifier 110 at peak power (a current scaling factor equal to one). Due to the load pulling that occurs between the main amplifier 110 and the auxiliary amplifier 115, it can be shown that operation of the Doherty amplifier 100 from the 6 dB cutoff through the peak power occurs at approximately maximum efficiency. However, this efficient operation comes at the cost of the quarter-wavelength transmission line sections at the input of the auxiliary amplifier 115 and the two quarter-wavelength transmission line sections between the output terminal of the main amplifier 110 and the output node 125. These quarter-wavelength transmission line sections are typically too bulky for integration into a mobile device such as a smartphone. In addition, the quarter-wavelength transmission line sections limit the bandwidth of the Doherty amplifier 100.

A Doherty amplifier is introduced with an advantageously wideband lumped-element combiner. Since the lumped-element combiner does not need any quarter-wavelength transmission line segments, the resulting Doherty amplifier is not only wideband but also advantageously compact having a peak efficient not only at peak power but also at a back-off power level γ. To provide such advantages, the input phase relationship to the input signals to the main and auxiliary amplifiers diverges from the quadrature relationship of a typical Doherty amplifier. In that regard, a generalized Doherty amplifier theory has been exploited herein. In such a generalized Doherty amplifier theory, a current scaling ratio $r_c$ as defined by the current conducted by the auxiliary amplifier at peak power divided by the current conducted by the main amplifier at peak power is bounded according to the following equation (1):

$$2/(\gamma+1) \le r_c < 1 \qquad \text{Eq. (1)}$$

where γ>1. The backoff power level γ for peak efficiency is typically determined by whatever is the average power of the RF input signal being amplified by the Doherty amplifier. In this fashion, peak efficiency is maintained not only at the average power of the RF input signal but also at the peak power of the RF input signal. Given the current ratio $r_c$ and the backoff level γ for peak efficiency, a backoff factor $\beta_{bk}$ is given by the following equation (2):

$$\beta_{bk} = \left(4r_c\gamma + (r_c-1)^2\right) - (rc-1)/2\gamma \qquad \text{Eq. (2)}$$

where $\beta_{bk}$ is the back-off from the peak power at which the auxiliary amplifier cuts off operation.

Given these factors, a phase delay θ of the input signal to the auxiliary amplifier as compared to the input signal to the main amplifier may be defined according to a phase delay factor $\theta_x$ as given by the following equation (3):

$$\theta_x = \tan^{-1}\left(\text{square root}\left((\beta_{bk}+r_c)/(1-r_c)\right)\right. \qquad \text{Eq. (3)}$$

From the phase delay factor $\theta_x$, the phase delay θ has four possible values as given by the following equations (4) and (5)

$$\theta = +/- \theta_x \quad \text{Eq. (4)}$$

$$\theta = +/- (\pi - \theta_x) \quad \text{Eq. (5)}$$

Since the backoff level γ for peak efficiency is typically determined by the average power of the RF input signal, it may be seen that the phase delay θ is controlled by the current scaling factor $r_c$. Given these factors and also the optimum output resistance ($R_{opt}$) for the output node, the two-port impedances Z11, Z12, and Z22 for a two-port Doherty combining network may be determined. As known in the generalized Doherty amplifier theory, the two-port impedances Z11, Z12, and Z22 are defined by the following equations (6), (7), and (8), respectively:

$$Z11 = R_{opt}/\beta_{bk} \quad \text{Eq. (6)}$$

$$Z12 = R_{opt}\, e^{j\theta}/r_c \quad \text{Eq. (7)}$$

$$Z22 = R_{opt}\, \beta_{bk}\left(r_c + e^{j2\theta}\right)/\left(r_c^2(1 - \beta_{bk})\right) \quad \text{Eq. (8)}$$

where it is assumed that the transistor(s) in the main amplifier are not oversized as compared to the transistor(s) in the auxiliary amplifier.

Referring again to the Doherty amplifier 100, it may be seen that the combining network 130 is a three-port network. The two-port impedances as defined by equations (6), (7), and (8) are readily converted into the impedances for a three-port network such as through a cascaded π-network conversion. This conversion has virtually an unlimited number of solutions for the three-port impedances. A particularly advantageous conversion is disclosed herein that uses the current scaling ratio $r_c$ as a design parameter to optimize the bandwidth of a Doherty amplifier having a lumped-element combining network. The following discussion will be directed to a Doherty amplifier design for use in the N77 bandwidth (3.3 GHZ to 4.2 GHZ) but it will be appreciated that the Doherty amplifier disclosed herein is readily adapted for use at other bandwidths. The following discussion will thus be directed to a Doherty amplifier adapted for use in the N77 bandwidth without loss of generality.

As compared to the quarter-wavelength transmission lines used in the combining network 130, the lumped-element combining network disclosed herein is advantageously compact. Moreover, the lumped-element combining network in conjunction with a reduced current scaling ratio $r_c$ results in an advantageously low return loss and peak dissipation loss across the operating bandwidth. As noted previously, the backoff level γ for peak efficiency is set by the average power of the RF input signal that is to be amplified by the Doherty amplifier. Thus, what remains as a parameter that may be varied to optimize the operating bandwidth is the current scaling ratio $r_c$. What is disclosed herein is that a current scaling ratio $r_c$ of $0.4 \le r_c \le 0.6$ results in an advantageously large operating bandwidth such as to provide satisfactory amplification across the entire N77 bandwidth. As can be seen from Equations (2) and (3), with the backoff level γ for peak efficiency is set by the average power of the RF input signal and the current scaling ratio $r_c$ tuned as defined herein, there are four possible values for the phase delay θ. From these four possible phase delays, an optimal phase delay θ is chosen.

Figure 2:
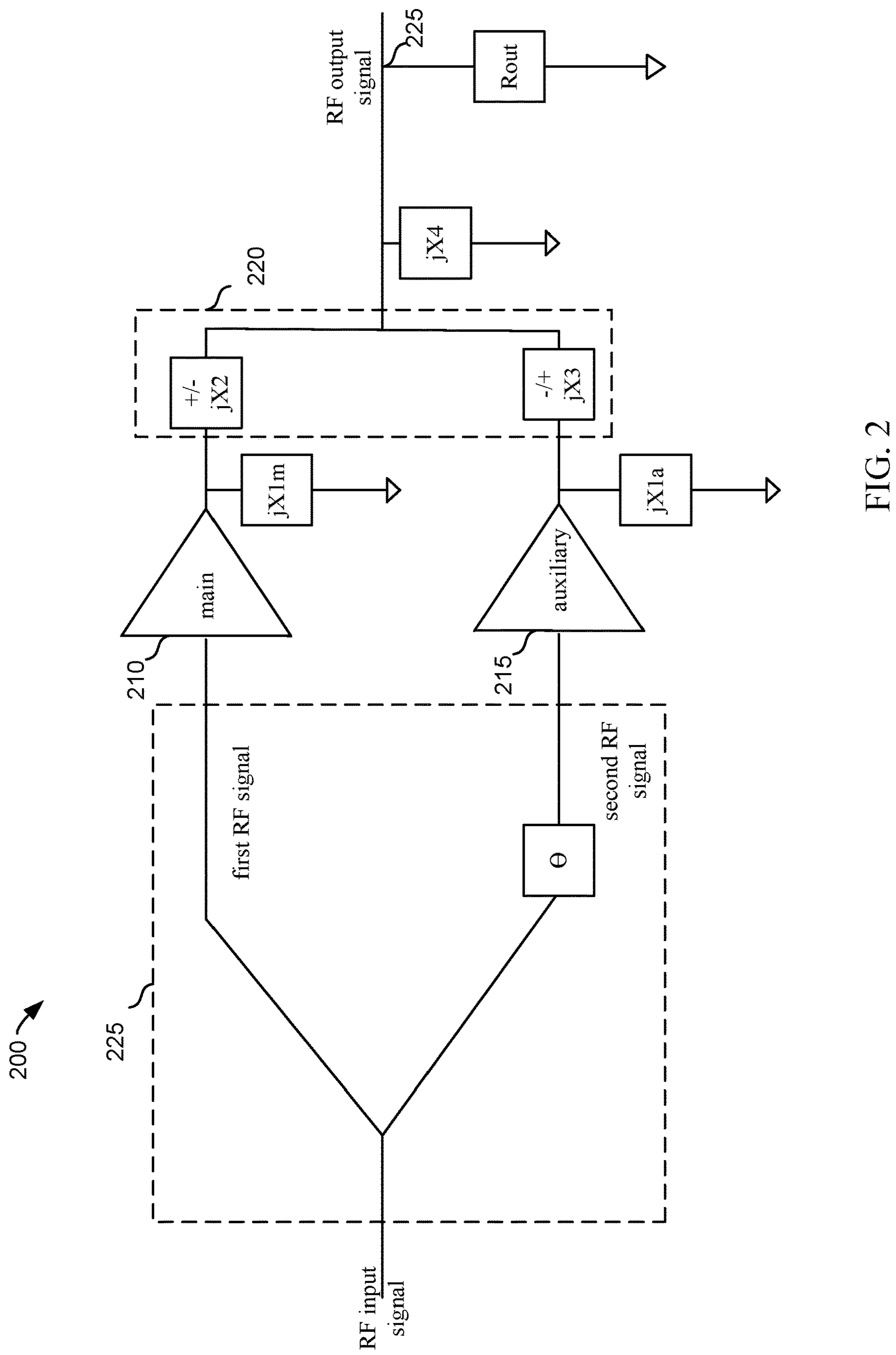
FIG. 2 illustrates a wideband Doherty amplifier in accordance with an aspect of the disclosure.

An example wideband Doherty amplifier 200 with a lumped-element combining network 220 is shown in FIG. 2. A splitter network 225 splits an RF input signal into a first RF signal that is amplified by a main amplifier 210 and into a second RF signal that is amplified by an auxiliary amplifier 215. It will be appreciated that the main amplifier 210 and the auxiliary amplifier 215 may each be a final amplifier in a corresponding amplification chain. For example, the main amplifier 210 may be the final amplifier in a first chain of one or more first amplifiers. Similarly, the auxiliary amplifier 215 may be a final amplifier in a second chain of one or more second amplifiers. In one implementation, each amplifier chain may begin with a pre-driver amplifier followed by a driver amplifier. The splitter network 225 would thus split the RF input signal to drive each amplifier chain. The splitter network 225 may be passive or active and may be implemented at baseband or in the RF domain. The power ratio between the first RF signal and the second RF signal depends upon a splitting power factor that may be determined from the current scaling ratio $r_c$ and the backoff factor $\beta_{bk}$ as known from the generalized Doherty amplifier theory. The second RF signal is delayed with respect to the first RF signal by the phase delay θ. For example, the splitter network 225 may include vector-sum phase-shifters (not illustrated) in some implementations for introducing the splitting factor and the phase delay θ between the first and second RF signals. A lumped-element combining network 220 combines an output signal from the main amplifier 210 and an output signal from the peaking amplifier 215 into an RF output signal at an output node 225. The lumped-element combining network 220 includes a reactance jX2 between an output terminal of the main amplifier 210 and the output node 225, where j is the square root of −1 and X2 is the amount of the reactance. Similarly, the lumped-element combining network 220 includes a reactance jX3 between an output terminal of the auxiliary amplifier 215 and the output node 225 that is of the opposite sign of the reactance jX2. Thus, should the reactance jX2 be formed by an inductor, then the reactance jX3 is formed by a capacitor. Conversely, should the reactance jX2 be formed by a capacitor, then the reactance jX3 is formed by an inductor. The main amplifier 210 is biased to operate either as a class B or a class AB amplifier. Conversely, the auxiliary amplifier 215 is biased to operate as a class C amplifier.

A reactance jX1*m* coupled between the output terminal of the main amplifier 210 and ground is optional and may be formed by a parasitic reactance of the main amplifier 210 in some implementations. Similarly, a reactance jX1*a* coupled between the output of the auxiliary amplifier 215 and ground is optional and may be formed by a parasitic reactance of the auxiliary amplifier 215 in some implementations. Finally, a reactance jX4 coupled between the output node 225 and ground may be formed by an output filter (not illustrated) in some implementations. It may thus be observed that just the two reactances of the lumped-element combining network 220 may be present in some implementations and the other reactances may be optional (or at least the other reactances may be incorporated as part of the surrounding circuitry in some but not all aspects).

Figure 3A:
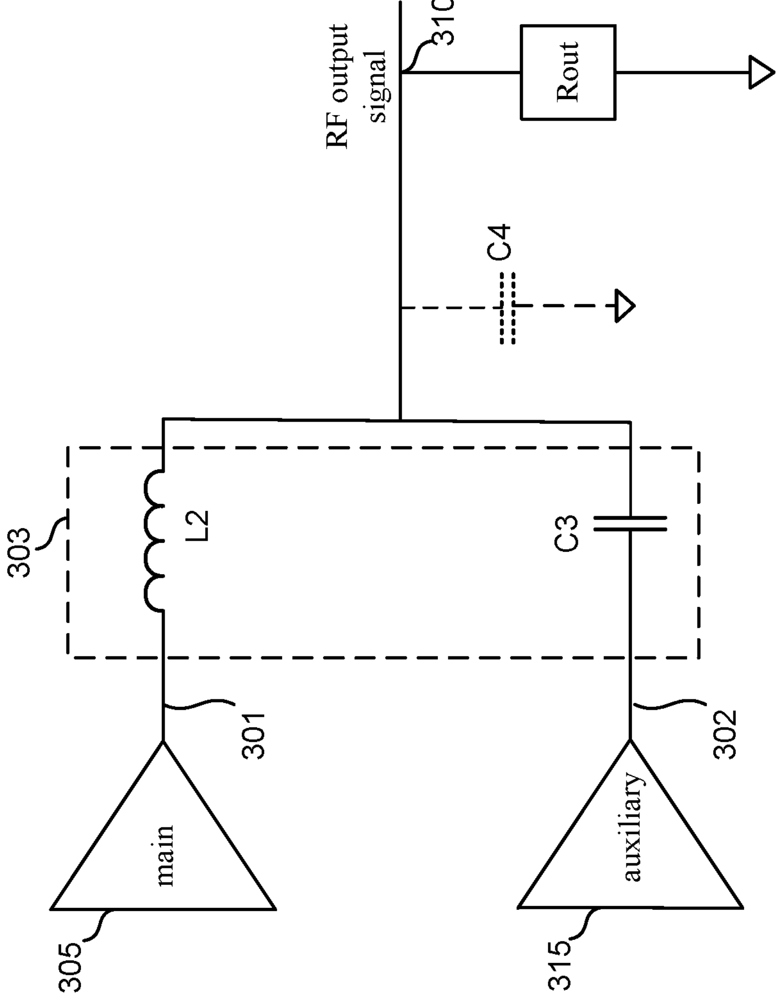
FIG. 3A illustrates a portion of the wideband Doherty amplifier of FIG. 2 with a first implementation of a lumped-element combing network in accordance with an aspect of the disclosure.
Figure 3A:

An example lumped-element combining network 303 is shown in more detail in FIG. 3A for a Doherty amplifier 300. Combining network 303 includes an inductor L2 that couples between an output terminal 301 of a main amplifier 305 and an output node 310 for the RF output signal. In addition, the lumped-element combining network 303 includes a capacitor C3 that couples between an output terminal 302 of an auxiliary amplifier 315 and the output node 310. Referring back to the lumped-element combining network 220, it may thus be seen that inductor L2 in lumped-element network 303 is an example of reactance jX2. With reactance jX2 thus being positive, the reactance jX3 in the lumped-element combining network 303 is negative as given by capacitor C3. Note that the optional reactances jX1*m* and jX1*a* are absent in the Doherty amplifier 300. An optional capacitor C4 that couples between the output node 310 and ground is an example of the reactance jX4. However, it will be appreciated that the only lumped-element reactances in combining network 303 may be just the inductor L2 and capacitor C3 in alternative implementations. An output load (Rout) couples between the output node 310 and ground.

Figure 3B:
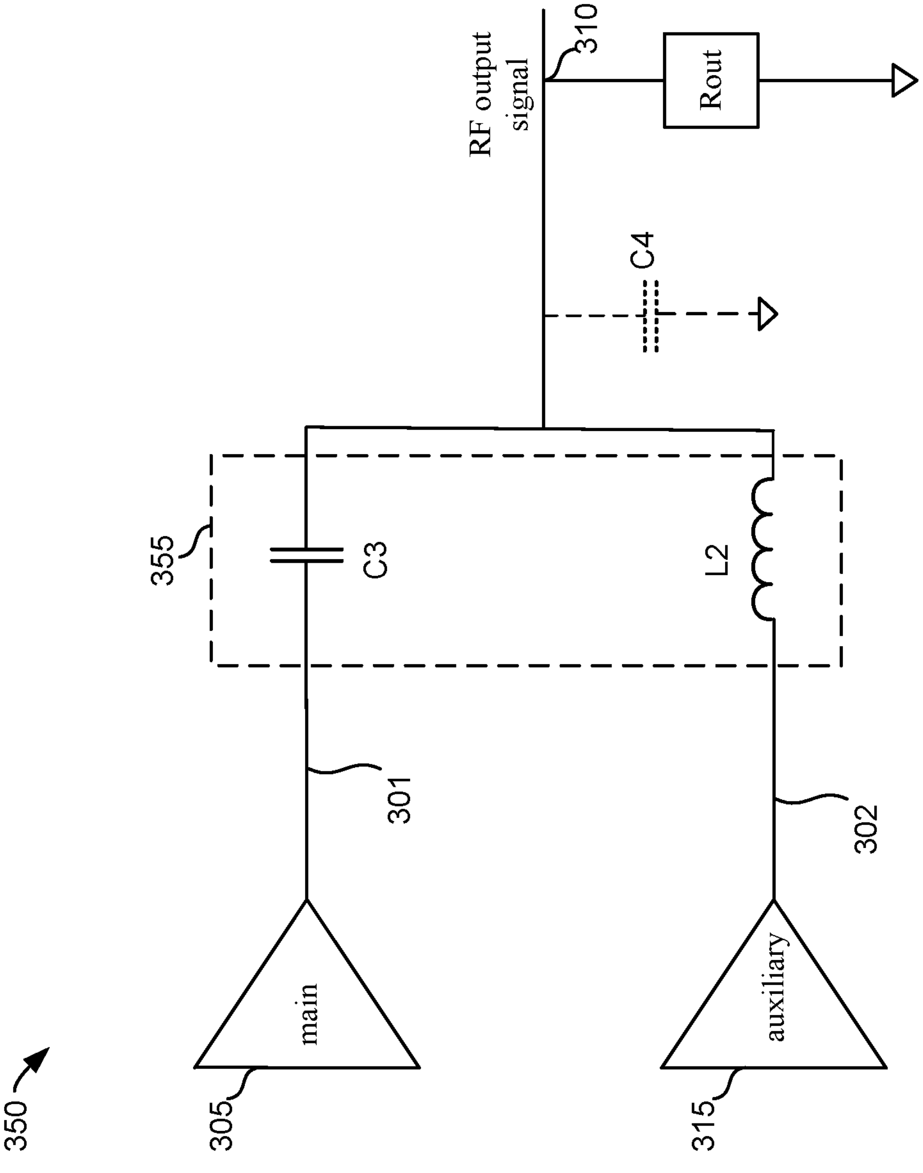
FIG. 3B illustrates a portion of the wideband Doherty amplifier of FIG. 2 with a second implementation of a lumped-element combing network in accordance with an aspect of the disclosure.

Another example lumped-element combining network 355 is shown in more detail in FIG. 3B for a Doherty amplifier 350. The main amplifier 305, the auxiliary amplifier 315, the capacitor C4, the output node 310, and the output load Rout are arranged as discussed for the Doherty amplifier 300. However, in the lumped-element combining network 355 it is a capacitor C3 that couples between the output terminal 301 of the main amplifier 305 and the output node 310. Thus, it is an inductor L2 in the lumped-element combining network 355 that couples between the output terminal 302 of the auxiliary amplifier 315 and the output node 310. Capacitor C4 is again optional and may be eliminated in alternative implementations.

Figure 4:
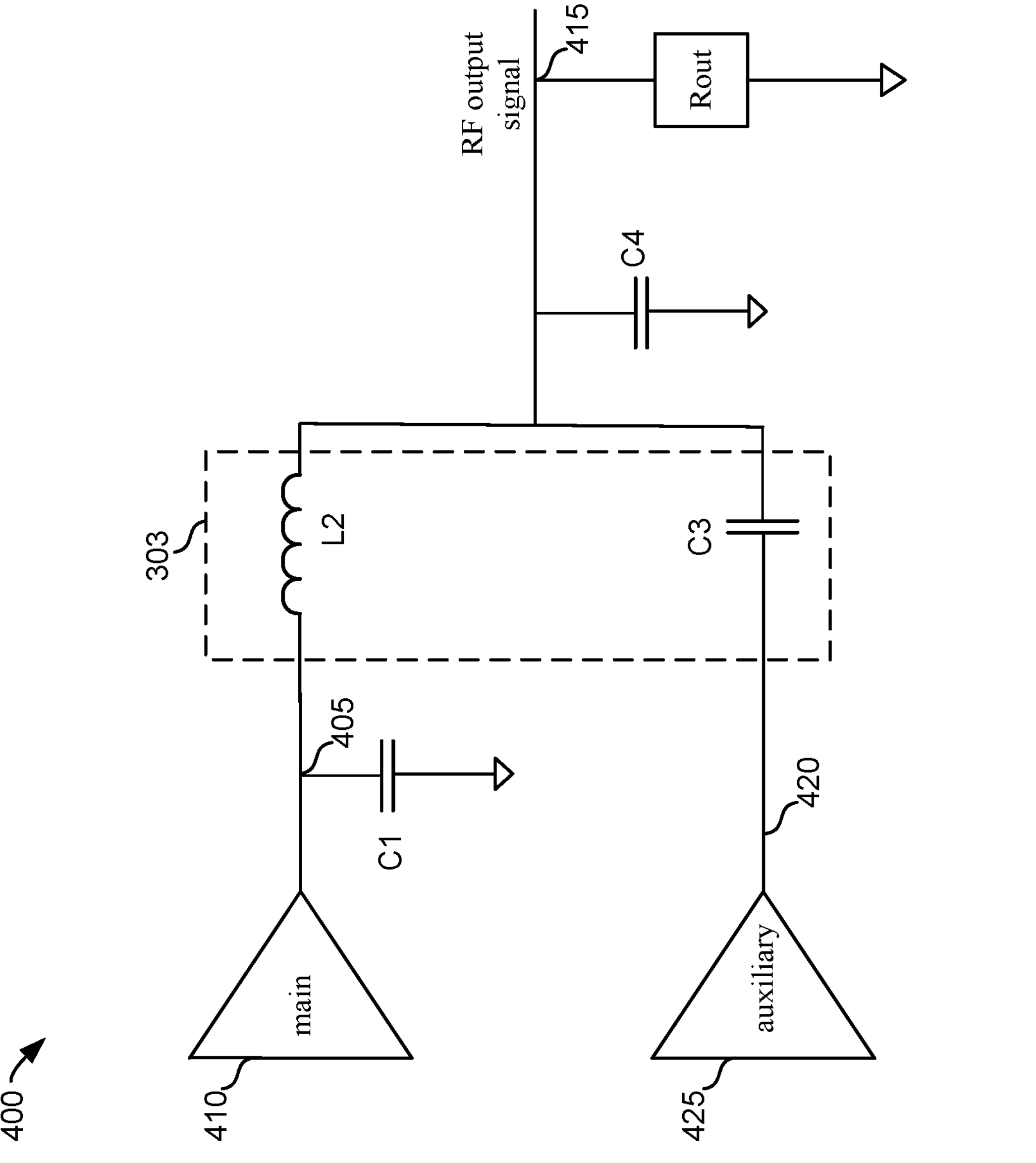
FIG. 4 illustrates a portion of the wideband Doherty amplifier of FIG. 2 with a third implementation of a lumped-element combing network in accordance with an aspect of the disclosure.

Another example Doherty amplifier 400 is illustrated in FIG. 4. The lumped-element combining network 303 and capacitor C4 are arranged analogously as discussed for the Doherty amplifier 300. The inductor L2 thus couples between an output terminal 405 of a main amplifier 410 and an output node 415. Similarly, the capacitor C3 couples between an output terminal 420 of an auxiliary amplifier 425 and the output node 415 whereas the capacitor C4 couples between the output node 415 and ground. The Doherty amplifier 400 also includes a capacitor C1 that couples between the output terminal 405 of the main amplifier 410 and ground to form the reactance jX1*m*. The reactance jX1*a* is absent in the Doherty amplifier 400.

Figure 5:
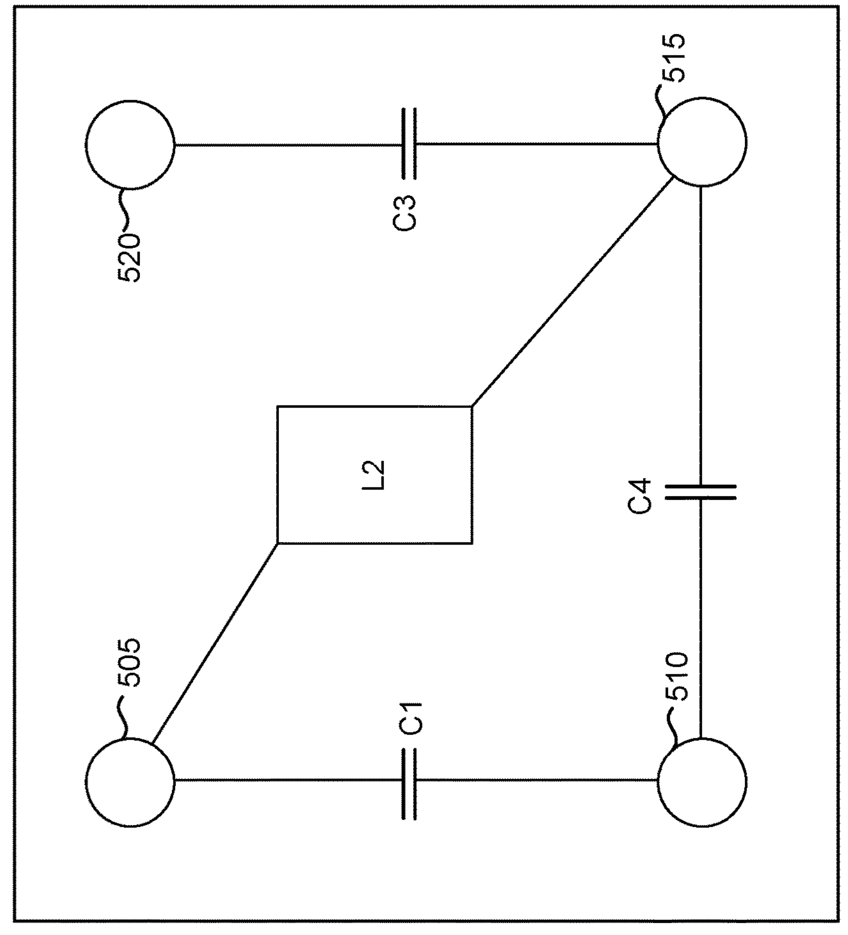
FIG. 5 illustrates a Doherty combiner semiconductor package in accordance with an aspect of the disclosure.
Figure 5:

The lumped-element combining network 303, capacitor C4, and capacitor C4 in the Doherty amplifier 400 are readily integrated into a relatively small die space such as through using an integrated passive device (IPD) implementation or through a surface mount device (SMD) process. An IPD package 500 of the combining network 303 and capacitors C1, C3, and C4 for the Doherty amplifier 400 is shown in FIG. 5. The IPD package 500 includes four terminals that are adjacent respective corners of the IPD package 500. The following discussion will be directed to a solder bump (or ball) implementation of the terminals but it will be appreciated that other terminal implementations may be used such as a copper pillar. A solder bump 505 couples to the output terminal 405 of the main amplifier 410 of the Doherty amplifier 400. Similarly, a solder bump 510 couples to a ground node for the package 500. A solder bump 515 couples to the output node 415 of the Doherty amplifier 400. Finally, a solder bump 520 couples to the output terminal 420 of the auxiliary amplifier 425. The capacitor C1 couples between the bumps 505 and 510. Similarly, the capacitor C4 couples between the bumps 510 and 515 whereas the capacitor C3 couples between the bumps 515 and 520. The inductor L2 couples between the bumps 505 and 515. As known in the IPD arts, capacitors C1, C3, and C4 may be formed as metal-insulator-metal (MIM) capacitors. The metal plates for the MIM capacitors may be formed by masking adjacent metal layers of the IPD package 500. Similarly, one or more metal layers may be masked and shaped into coils to form inductor L2. Package 500 may have an advantageously compact planar rectangular profile that is just a few hundred microns in width and length.

Figure 6A:
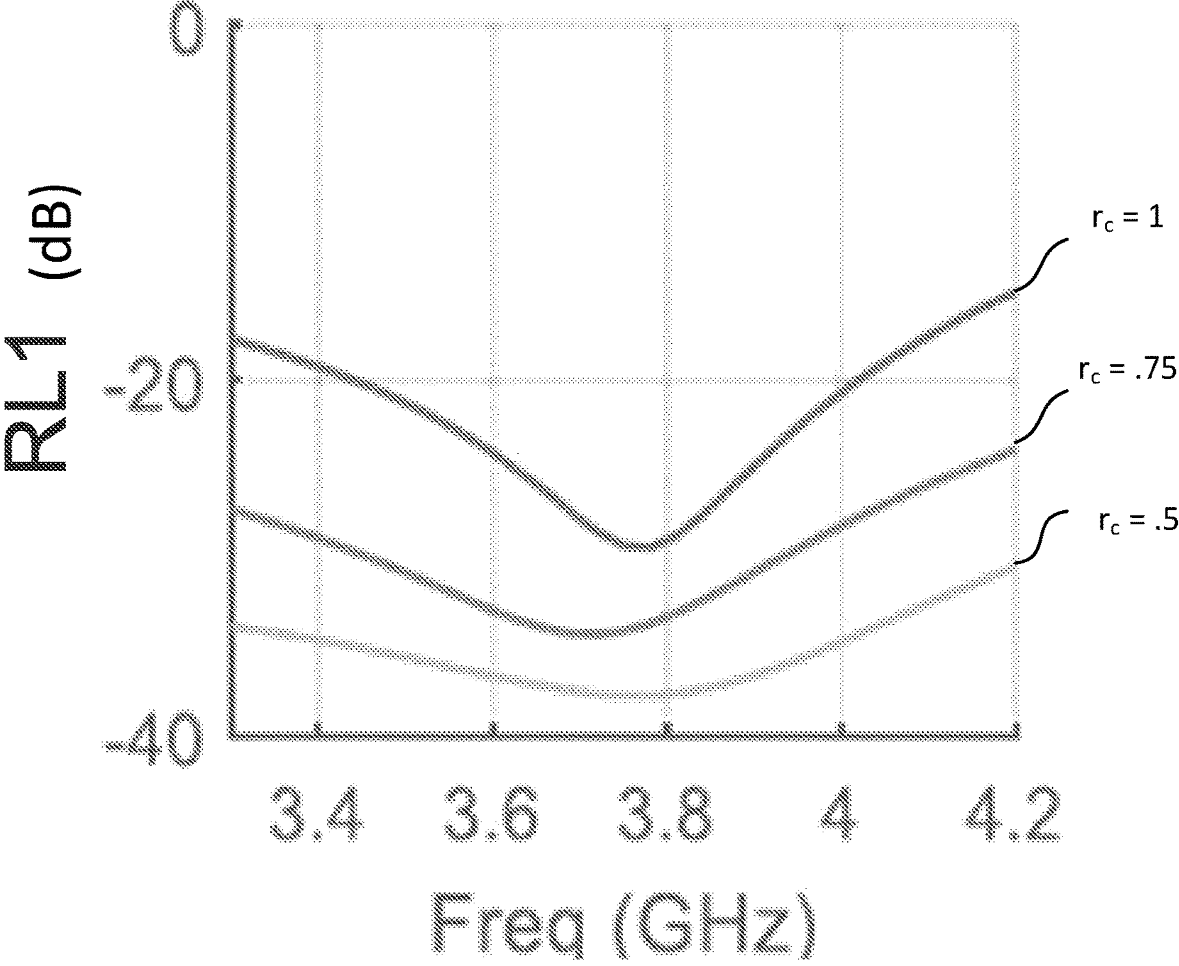
FIG. 6A is a plot of the Doherty combiner return loss as a function of frequency across the N77 band for a variety of current scaling factors in accordance with an aspect of the disclosure.
Figure 6B:
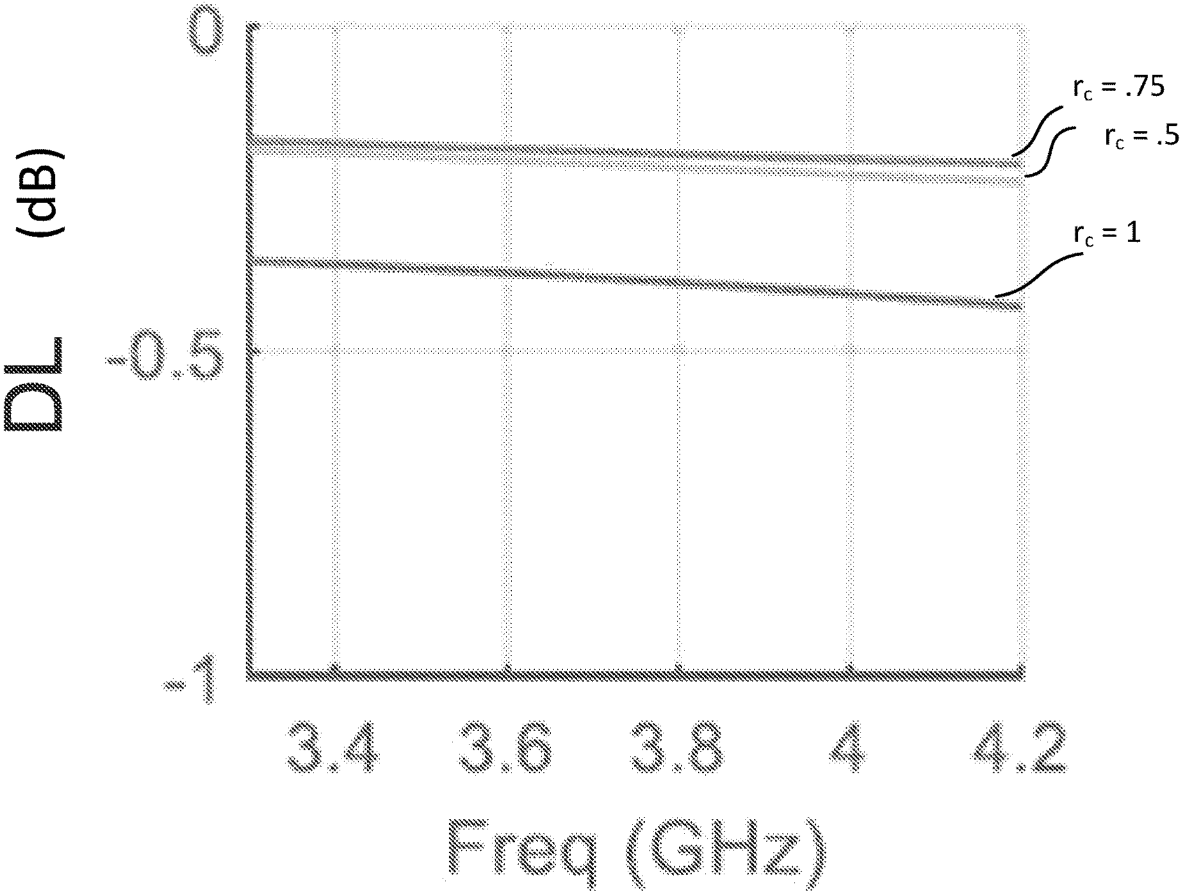
FIG. 6B is a plot of the Doherty combiner dissipation loss as a function of frequency across the N77 band for a variety of current scaling factors in accordance with an aspect of the disclosure.
Figure 7:
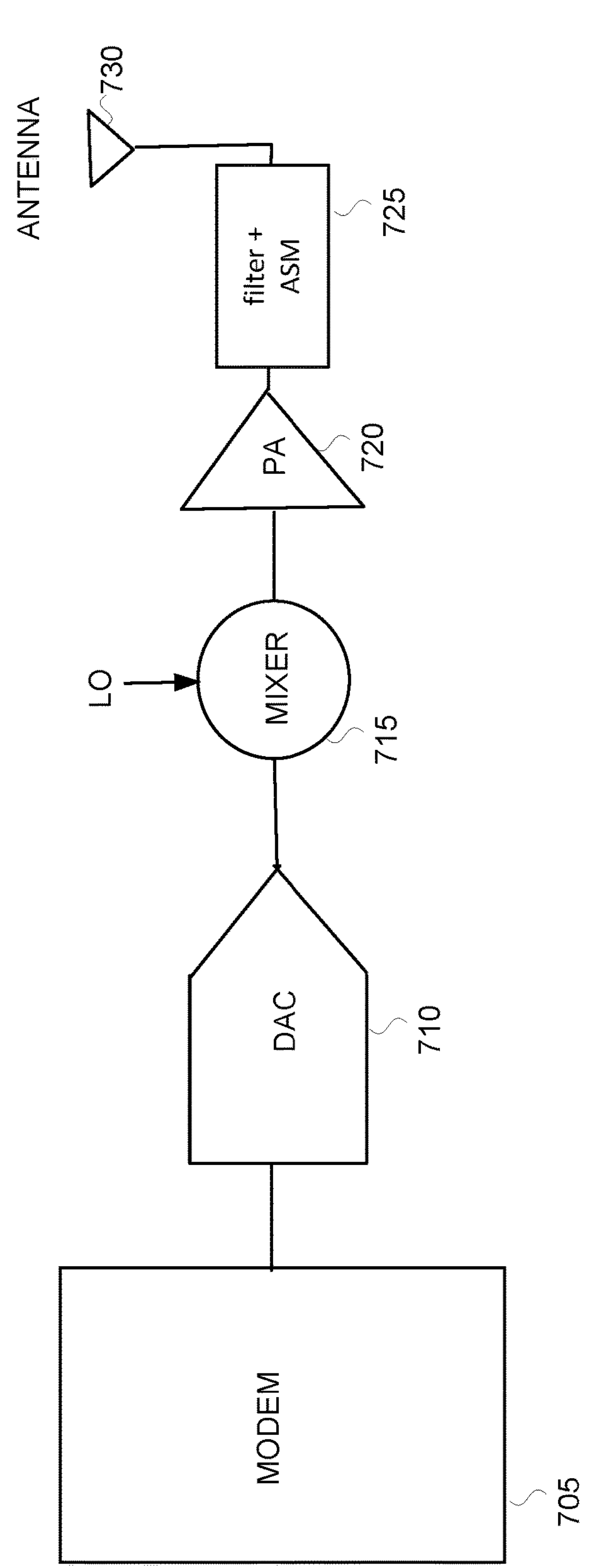
FIG. 7 illustrates a transceiver transmit path in which the power amplifier is implemented as a wideband Doherty amplifier as disclosed herein in accordance with an aspect of the disclosure.

The enhanced Doherty amplifier bandwidth produced by the current scaling and lumped-element combining network disclosed herein may be better appreciated with respect to plots of FIGS. 6A and 6B. FIG. 6A is a plot of the simulated return loss (RL1) of a lumped-element combining network across the N77 bandwidth (from 3.3 GHZ to 4.2 GHz) for a current scaling ratio $r_c$ of 0.5, 0.75, and 1.0. It may be seen that at the upper and lower end of the N77 bandwidth, the use of a current scaling ratio $r_c$ of 0.5 has nearly 20 dB lower return loss as compared to the use of a current scaling ratio $r_c$ of 1.0. FIG. 6B is a plot of the simulated dissipation loss of the lumped-element combining network across the N77 bandwidth for the same current scaling ratios. It may be seen that a current scaling ratio of either 0.5 or 0.75 provides approximately 0.25 dB lower dissipation loss as compared to the use of the 1.0 current scaling ratio.

A system-level diagram of the transmit path in a mobile device transceiver 700 such as a cellular telephone transceiver that includes a power amplifier (PA) 720 implemented using a Doherty amplifier with the reduced current scaling ratio and the lumped-element combining network as disclosed herein. A digital processor such as a modem 705 generates a digital baseband signal that is converted by a digital-to-analog converter (DAC) 710 into an analog baseband signal. One or more mixers 715 mix the analog baseband signal with a local oscillator (LO) signal to up convert the analog baseband signal in frequency to an RF input signal so that the PA 720 may amplify the RF input signal into an RF output signal. A frontend module (FEM) 725 includes filters and an antenna switch module (ASM) for processing the RF output signal before it is transmitted over one or more antennas 730. It will be appreciated that the system-level diagram of the transceiver 700 is a simplified diagram and a variety of different configurations with more transmit paths, receive paths, and other various configurations are possible. And that such techniques may be applied in both base stations, mobile devices, or other devices (although the techniques provided herein may have advantages for implementation in a device such as a mobile device).

Figure 8:
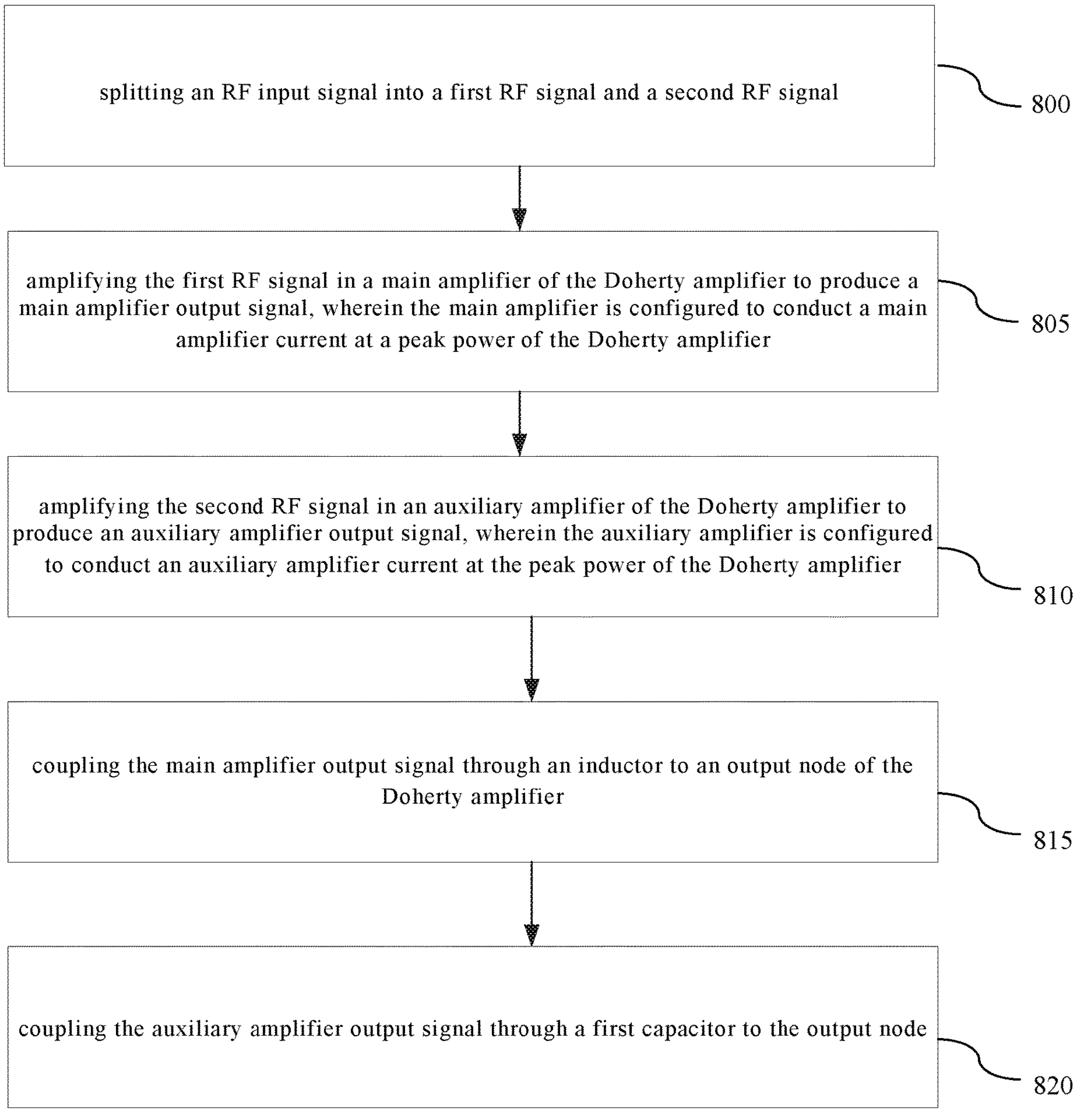
FIG. 8 is a flowchart for a method of operation of a Doherty amplifier in accordance with an aspect of the disclosure.

A method of operation for a Doherty amplifier will now be discussed with regard to the flowchart of FIG. 8. The method includes an act 800 of splitting an RF input signal into a first RF signal and a second RF signal. The operation of the splitter 225 is an example of act 800. In addition, the method includes an act 805 of amplifying the first RF signal in a main amplifier of the Doherty amplifier to produce a main amplifier output signal, wherein the main amplifier is configured to conduct a main amplifier current at a peak power of the Doherty amplifier. The amplification by any of the main amplifiers 210, 305, and 410 is an example of act 805. The method also includes an act 810 of amplifying the second RF signal in an auxiliary amplifier of the Doherty amplifier to produce an auxiliary amplifier output signal, wherein the auxiliary amplifier is configured to conduct an auxiliary amplifier current at the peak power of the Doherty amplifier. In addition, the method includes an act 815 of coupling the main amplifier output signal through an inductor to an output node of the Doherty amplifier. The coupling through the inductor L2 in the lumped-element combining network 303 is an example of act 815. Finally, the method includes an act 820 of coupling the auxiliary amplifier output signal through a first capacitor to the output node. The coupling through the capacitor C3 in the lumped-element combining network 303 is an example of act 820.

The disclosure will now be summarized in the following example clauses.

Clause 1. A Doherty amplifier, comprising:

a main amplifier configured to conduct a main amplifier current at a peak power of the Doherty amplifier;

an auxiliary amplifier configured to conduct an auxiliary amplifier current at the peak power of the Doherty amplifier, wherein a current scaling ratio as defined by a ratio of the auxiliary amplifier current to the main amplifier current is greater than or equal to 0.4 and less than or equal to 0.6;

an output node;

an inductor coupled between an output terminal of the main amplifier and the output node; and a first capacitor coupled between an output terminal of the auxiliary amplifier and the output node.

Clause 2. The Doherty amplifier of clause 1, further comprising:

a second capacitor coupled between the output terminal of the main amplifier and ground.

Clause 3. The Doherty amplifier of clause 1, further comprising:

a third capacitor coupled between the output node and ground.

Clause 4. The Doherty amplifier of clause 1, wherein a phase difference between the auxiliary amplifier current and the main amplifier current is less than 90°.

Clause 5. The Doherty amplifier of clause 1, wherein a phase difference between the auxiliary amplifier current and the main amplifier current is greater than 90°.

Clause 6. The Doherty amplifier of clause 1, further comprising:

a splitter configured to split an RF input signal into a first RF signal and a second RF signal, wherein the main amplifier is further configured to amplify the first RF signal and the auxiliary amplifier is further configured to amplify the second RF signal.

Clause 7. The Doherty amplifier of clause 6, wherein the RF input signal is an N77 frequency band signal.

Clause 8. The Doherty amplifier of clause 1, wherein the main amplifier is biased to operate as a class B amplifier and the auxiliary amplifier is biased to operate as a class C amplifier.

Clause 9. The Doherty amplifier of clause 1, wherein the main amplifier is biased to operate as a class AB amplifier and the auxiliary amplifier is biased to operate as a class C amplifier.

Clause 10. The Doherty amplifier of clause 1, wherein the Doherty amplifier is configured to form a power amplifier for a mobile device.

Clause 11. The Doherty amplifier of clause 1, wherein the inductor is the only lumped-element reactance coupled between the output terminal of the main amplifier and the output node, and wherein the first capacitor is the only lumped-element reactance coupled between the output terminal of the auxiliary amplifier and the output node.

Clause 12. A Doherty combiner semiconductor package for a Doherty amplifier, comprising:

a first terminal configured to couple to an output terminal of a main amplifier in the Doherty amplifier;

a second terminal configured to couple to an output terminal of an auxiliary amplifier in the Doherty amplifier;

a third terminal configured to couple to an output node of the Doherty amplifier;

a coil coupled between the first terminal and the third terminal; and a first capacitor coupled between the second terminal and the third terminal.

Clause 13. The Doherty combiner semiconductor package of clause 12, further comprising:

a fourth terminal configured to couple to ground; and a second capacitor coupled between the first terminal and the fourth terminal.

Clause 14. The Doherty combiner semiconductor package of clause 13, further comprising:

a third capacitor coupled between the third terminal and the fourth terminal.

Clause 15. The Doherty combiner semiconductor package of clause 13, wherein the Doherty combiner semiconductor package is a planar rectangular semiconductor package, and wherein the first terminal is adjacent a first corner of the planar rectangular semiconductor package, the second terminal is adjacent a second corner of the planar rectangular semiconductor package, the third terminal is adjacent a third corner of the planar rectangular semiconductor package, and the fourth terminal is adjacent a fourth corner of the planar rectangular semiconductor package.

Clause 16. The Doherty combiner semiconductor package of clause 13, wherein each of the first terminal, the second terminal, the third terminal, and the fourth terminal comprises a solder bump.

Clause 17. The Doherty combiner semiconductor package of clause 12, wherein the inductor and the first capacitor are the only lumped-element reactances in the Doherty combiner semiconductor package.

Clause 18. A Doherty amplifier, comprising:

a main amplifier configured to conduct a main amplifier current at a peak power of the Doherty amplifier;

an auxiliary amplifier configured to conduct an auxiliary amplifier current at the peak power of the Doherty amplifier, wherein a current ratio $r_c$ as defined by a ratio of the auxiliary amplifier current to the main amplifier current is greater than or equal to 0.4 and less than or equal to 0.6;

an output node;

a first capacitor coupled between an output terminal of the main amplifier and the output node; and an inductor coupled between an output terminal of the auxiliary amplifier and the output node.

Clause 19. The Doherty amplifier of clause 18, further comprising:

a second capacitor coupled between the output node and ground.

Clause 20. The Doherty amplifier of clause 18, wherein a phase difference between the auxiliary amplifier current and the main amplifier current is less than 90°.

Clause 21. The Doherty amplifier of clause 18, wherein a phase difference between the auxiliary amplifier current and the main amplifier current is greater than 90°.

Clause 22. The Doherty amplifier of clause 18, further comprising:

a splitter configured to split an RF input signal into a first RF signal and a second RF signal, wherein the main amplifier is further configured to amplify the first RF signal and the auxiliary amplifier is further configured to amplify the second RF signal, and wherein the RF input signal is an N77 frequency band signal.

Clause 23. The Doherty amplifier of clause 18, wherein the main amplifier is biased to operate as a class B amplifier and the auxiliary amplifier is biased to operate as a class C amplifier.

Clause 24. The Doherty amplifier of clause 18, wherein the main amplifier is biased to operate as a class AB amplifier and the auxiliary amplifier is biased to operate as a class C amplifier.

Clause 25. A method of operation for a Doherty amplifier, comprising:

splitting an RF input signal into a first RF signal and a second RF signal;

amplifying the first RF signal in a main amplifier of the Doherty amplifier to produce a main amplifier output signal, wherein the main amplifier is configured to conduct a main amplifier current at a peak power of the Doherty amplifier;

amplifying the second RF signal in an auxiliary amplifier of the Doherty amplifier to produce an auxiliary amplifier output signal, wherein the auxiliary amplifier is configured to conduct an auxiliary amplifier current at the peak power of the Doherty amplifier;

coupling the main amplifier output signal through an inductor to an output node of the Doherty amplifier; and coupling the auxiliary amplifier output signal through a first capacitor to the output node.

Clause 26. The method of clause 25, further comprising:

coupling an output terminal of the main amplifier to ground through a second capacitor.

Clause 27. The method of clause 26, further comprising:

coupling the output node to ground through a third capacitor.

Clause 28. The method of clause 25, wherein splitting the RF input signal delays the second RF signal with respect to the first RF signal by a phase delay to cause a current scaling ratio of the auxiliary amplifier current to the main amplifier current to be within a range that is greater than or equal to 0.4 and less than or equal to 0.6.

Clause 29. The method of clause 28, wherein the phase delay is less than 90°.

Clause 30. The method of clause 28, wherein the phase delay is greater than 90°.

Clause 31. A Doherty amplifier, comprising:

a main amplifier;

an auxiliary amplifier;

an output node;

an inductor coupled between an output terminal of the main amplifier and the output node; and a first capacitor coupled between an output terminal of the auxiliary amplifier and the output node.

In some instances, well-known structures and devices are shown in block diagram form in order to avoid obscuring the concepts of the described examples. The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A Doherty amplifier, comprising:

a main amplifier configured to conduct a main amplifier current at a peak power of the Doherty amplifier;

an auxiliary amplifier configured to conduct an auxiliary amplifier current at the peak power of the Doherty amplifier, wherein a current scaling ratio as defined by a ratio of the auxiliary amplifier current to the main amplifier current is greater than or equal to 0.4 and less than or equal to 0.6;

an output node;

an inductor coupled between an output terminal of the main amplifier and the output node; and a first capacitor coupled between an output terminal of the auxiliary amplifier and the output node, wherein the inductor is the only lumped-element reactance coupled between the output terminal of the main amplifier and the output node, and wherein the first capacitor is the only lumped-element reactance coupled between the output terminal of the auxiliary amplifier and the output node.

2. The Doherty amplifier of claim 1, further comprising:

a second capacitor coupled between the output terminal of the main amplifier and ground.

3. The Doherty amplifier of claim 1, further comprising:

a third capacitor coupled between the output node and ground.

4. The Doherty amplifier of claim 1, wherein a phase difference between the auxiliary amplifier current and the main amplifier current is less than 90°.

5. The Doherty amplifier of claim 1, wherein a phase difference between the auxiliary amplifier current and the main amplifier current is greater than 90°.

6. The Doherty amplifier of claim 1, further comprising:

a splitter configured to split an RF input signal into a first RF signal and a second RF signal, wherein the main amplifier is further configured to amplify the first RF signal and the auxiliary amplifier is further configured to amplify the second RF signal.

7. The Doherty amplifier of claim 6, wherein the RF input signal is an N77 frequency band signal.

8. The Doherty amplifier of claim 1, wherein the main amplifier is biased to operate as a class B amplifier and the auxiliary amplifier is biased to operate as a class C amplifier.

9. The Doherty amplifier of claim 1, wherein the main amplifier is biased to operate as a class AB amplifier and the auxiliary amplifier is biased to operate as a class C amplifier.

10. The Doherty amplifier of claim 1, wherein the Doherty amplifier is configured to form a power amplifier for a mobile device.

11. A Doherty combiner semiconductor package for a Doherty amplifier, comprising:

a first terminal configured to couple to an output terminal of a main amplifier in the Doherty amplifier;

a second terminal configured to couple to an output terminal of an auxiliary amplifier in the Doherty amplifier;

a third terminal configured to couple to an output node of the Doherty amplifier;

an inductor coupled between the first terminal and the third terminal; and a first capacitor coupled between the second terminal and the third terminal, wherein the inductor and the first capacitor are the only lumped-element reactances in the Doherty combiner semiconductor package.

12. The Doherty combiner semiconductor package of claim 11, further comprising:

a fourth terminal configured to couple to ground.

13. The Doherty combiner semiconductor package of claim 12, wherein the Doherty combiner semiconductor package is a planar rectangular semiconductor package, and wherein the first terminal is adjacent a first corner of the planar rectangular semiconductor package, the second terminal is adjacent a second corner of the planar rectangular semiconductor package, the third terminal is adjacent a third corner of the planar rectangular semiconductor package, and the fourth terminal is adjacent a fourth corner of the planar rectangular semiconductor package.

14. A Doherty amplifier, comprising:

a main amplifier configured to conduct a main amplifier current at a peak power of the Doherty amplifier;

an auxiliary amplifier configured to conduct an auxiliary amplifier current at the peak power of the Doherty amplifier, wherein a current ratio $r_c$ as defined by a ratio of the auxiliary amplifier current to the main amplifier current is greater than or equal to 0.4 and less than or equal to 0.6;

an output node;

a first capacitor coupled between an output terminal of the main amplifier and the output node;

an inductor coupled between an output terminal of the auxiliary amplifier and the output node; and a splitter configured to split an RF input signal into a first RF signal and a second RF signal, wherein the main amplifier is further configured to amplify the first RF signal and the auxiliary amplifier is further configured to amplify the second RF signal, and wherein the RF input signal is an N77 frequency band signal.

15. The Doherty amplifier of claim 14, further comprising:

a second capacitor coupled between the output node and ground.

16. The Doherty amplifier of claim 14, wherein a phase difference between the auxiliary amplifier current and the main amplifier current is less than 90°.

17. The Doherty amplifier of claim 14, wherein a phase difference between the auxiliary amplifier current and the main amplifier current is greater than 90°.

18. The Doherty amplifier of claim 14, wherein the main amplifier is biased to operate as a class B amplifier and the auxiliary amplifier is biased to operate as a class C amplifier.

19. The Doherty amplifier of claim 14, wherein the main amplifier is biased to operate as a class AB amplifier and the auxiliary amplifier is biased to operate as a class C amplifier.

20. A method of operation for a Doherty amplifier, comprising:

splitting an RF input signal into a first RF signal and a second RF signal;

amplifying the first RF signal in a main amplifier of the Doherty amplifier to produce a main amplifier output signal, wherein the main amplifier is configured to conduct a main amplifier current at a peak power of the Doherty amplifier;

amplifying the second RF signal in an auxiliary amplifier of the Doherty amplifier to produce an auxiliary amplifier output signal, wherein the auxiliary amplifier is configured to conduct an auxiliary amplifier current at the peak power of the Doherty amplifier;

coupling the main amplifier output signal through an inductor to an output node of the Doherty amplifier; and coupling the auxiliary amplifier output signal through a first capacitor to the output node, wherein splitting the RF input signal delays the second RF signal with respect to the first RF signal by a phase delay to cause a current scaling ratio of the auxiliary amplifier current to the main amplifier current to be within a range that is greater than or equal to 0.4 and less than or equal to 0.6.

21. The method of claim 20, further comprising:

coupling an output terminal of the main amplifier to ground through a second capacitor.

22. The method of claim 21, further comprising:

coupling the output node to ground through a third capacitor.

23. The method of claim 20, wherein the phase delay is less than 90°.

24. The method of claim 20, wherein the phase delay is greater than 90°.

25. A Doherty amplifier, comprising:

a main amplifier configured to conduct a main amplifier current at a peak power of the Doherty amplifier;

an auxiliary amplifier configured to conduct an auxiliary amplifier current at the peak power of the Doherty amplifier, wherein a current scaling ratio as defined by a ratio of the auxiliary amplifier current to the main amplifier current is greater than or equal to 0.4 and less than or equal to 0.6;

an output node;

a capacitor coupled between an output terminal of the main amplifier and the output node; and an inductor coupled between an output terminal of the auxiliary amplifier and the output node, wherein the capacitor is the only lumped-element reactance coupled between the output terminal of the main amplifier and the output node, and wherein the inductor is the only lumped-element reactance coupled between the output terminal of the auxiliary amplifier and the output node.

26. The Doherty amplifier of claim 25, wherein a phase difference between the auxiliary amplifier current and the main amplifier current is less than 90°.

27. The Doherty amplifier of claim 25, wherein a phase difference between the auxiliary amplifier current and the main amplifier current is greater than 90°.

28. The Doherty amplifier of claim 25, further comprising:

a splitter configured to split an RF input signal into a first RF signal and a second RF signal, wherein the main amplifier is further configured to amplify the first RF signal and the auxiliary amplifier is further configured to amplify the second RF signal.

29. The Doherty amplifier of claim 28, wherein the RF input signal is an N77 frequency band signal.

30. The Doherty amplifier of claim 25, wherein the main amplifier is biased to operate as a class B or AB amplifier and the auxiliary amplifier is biased to operate as a class C amplifier.

* * * * *